United States Patent [19]
Robinson et al.

[11] Patent Number: 5,944,555
[45] Date of Patent: Aug. 31, 1999

[54] APPARATUS FOR GROUNDING EXTERNAL METAL WATTHOUR METER COMPONENT

[75] Inventors: Darrell Robinson, Highland Township; Robert O. Learmont, Walled Lake, both of Mich.

[73] Assignee: Ekstrom Industries, Inc., Farmington Hills, Mich.

[21] Appl. No.: 08/877,694

[22] Filed: Jun. 17, 1997

Related U.S. Application Data

[62] Division of application No. 08/611,933, Mar. 6, 1996, Pat. No. 5,704,804.

[51] Int. Cl.$^6$ .................................................. H01R 33/945
[52] U.S. Cl. ............................................................ 439/517
[58] Field of Search .................................. 439/517, 508; 361/659, 664, 665, 666, 667

[56] References Cited

U.S. PATENT DOCUMENTS

| | | |
|---|---|---|
| Re. 34,531 | 2/1994 | Bell et al. ................. 439/135 |
| 2,030,522 | 2/1936 | Johansson ................. 175/183 |
| 3,061,763 | 10/1962 | Ekstrom . | 
| 3,221,216 | 11/1965 | Kobryner ................. 317/104 |
| 4,772,213 | 9/1988 | Bell et al. ................. 439/135 |
| 4,823,572 | 4/1989 | Signorelli ................. 70/163 |
| 4,892,485 | 1/1990 | Patton ................. 439/167 |
| 4,934,747 | 6/1990 | Langdon et al. ................. 292/256.67 |
| 5,088,004 | 2/1992 | Howell ................. 361/373 |
| 5,145,403 | 9/1992 | Schaffert et al. ................. 439/508 |
| 5,181,166 | 1/1993 | Howell ................. 361/364 |
| 5,207,595 | 5/1993 | Learmont et al. ................. 439/517 |
| 5,385,486 | 1/1995 | Robinson et al. ................. 439/517 |
| 5,423,695 | 6/1995 | Robinson et al. ................. 439/517 |
| 5,577,333 | 11/1996 | Robinson et al. ................. 439/517 |

OTHER PUBLICATIONS

Grote & Hartman Product Catalog, 1993.
Long Life For Power Contacts, Machine Design, Jan. 11, 1990.
Series Reconnect Device Series SRD–51900, Scientific Atlanta Instrumentation Group, 1992.

*Primary Examiner*—Neil Abrams
*Assistant Examiner*—T C Patel
*Attorney, Agent, or Firm*—Young & Basile, PC

[57] ABSTRACT

A watthour meter socket adapter electrically connects an external sealing ring and/or a metal cover ring on a watthour meter to ground. A surge ground conductor is mounted on an end mounting flange of the socket adapter housing and extends within and is joined to the housing by a first metal fastener. One end of the first metal fastener extends exteriorly of the housing and supports a first metal tab which is engaged by the metal sealing ring. A second metal fastener extends through the surge ground conductor and supports a second external tab engagable with a grounded meter socket cover. Alternately, a tab extends integrally from an upper end of the surge ground conductor for engagement with the sealing ring. In another embodiment, an annular surge ground conductor is mounted within an annular sidewall of a watthour meter socket adapter housing. A flange extends from one end of the surge ground conductor through a slot in a terminal cover into proximity with a sealing ring mountable about a mounting flange on the housing and a mating mounting flange carrying a metal cover ring on a watthour meter. A wire seal is passable through the flange and the sealing ring to electrically connect the metal cover ring on the watthour meter, the sealing ring and the flange on the surge ground conductor to a ground connection.

9 Claims, 9 Drawing Sheets

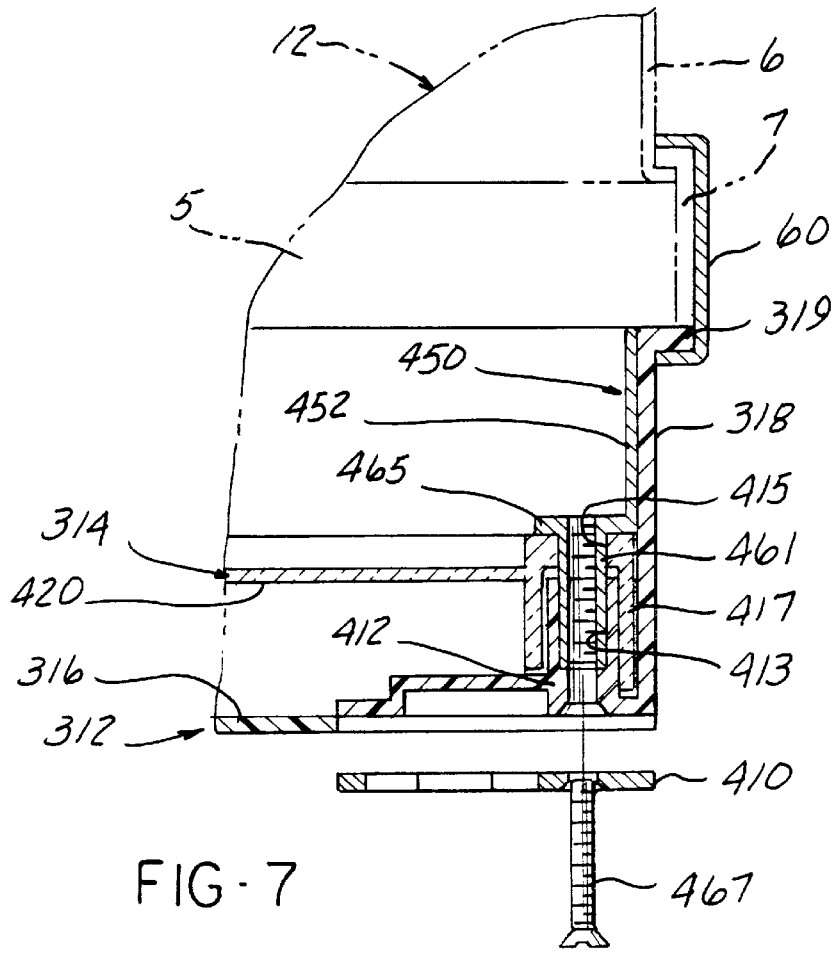
FIG·7
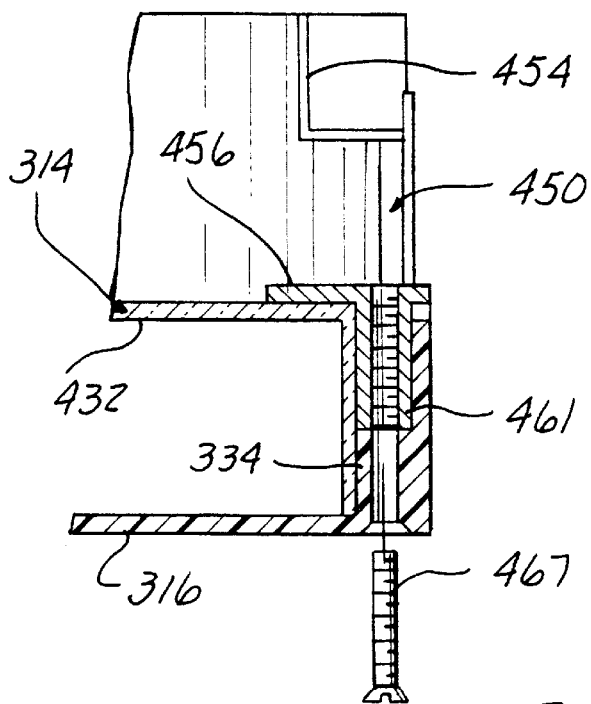
FIG·8

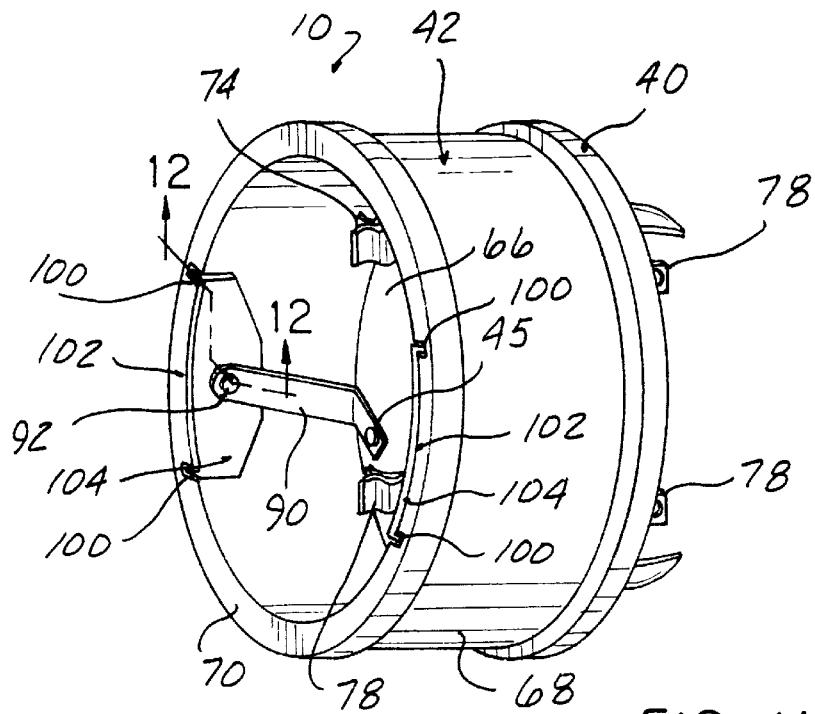
FIG-11
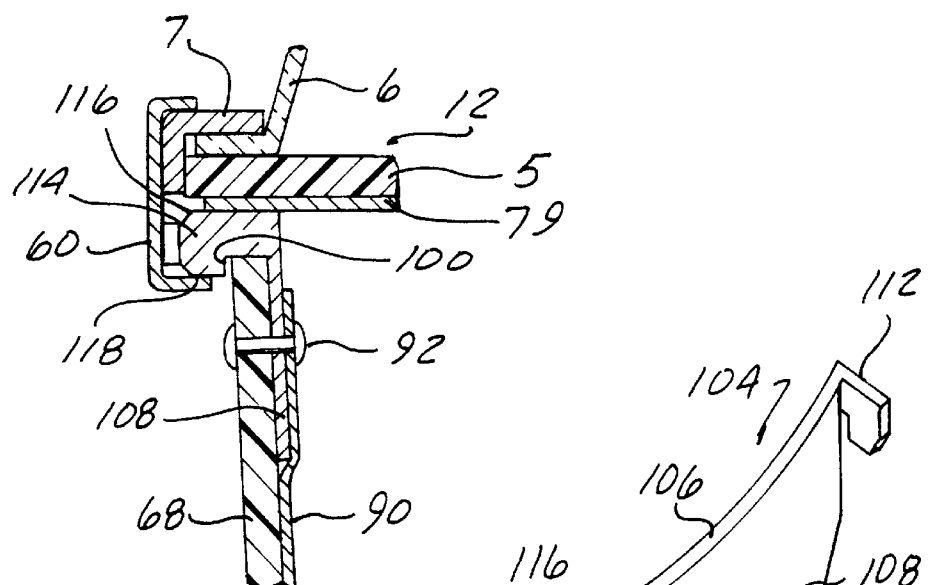
FIG-12
FIG-13

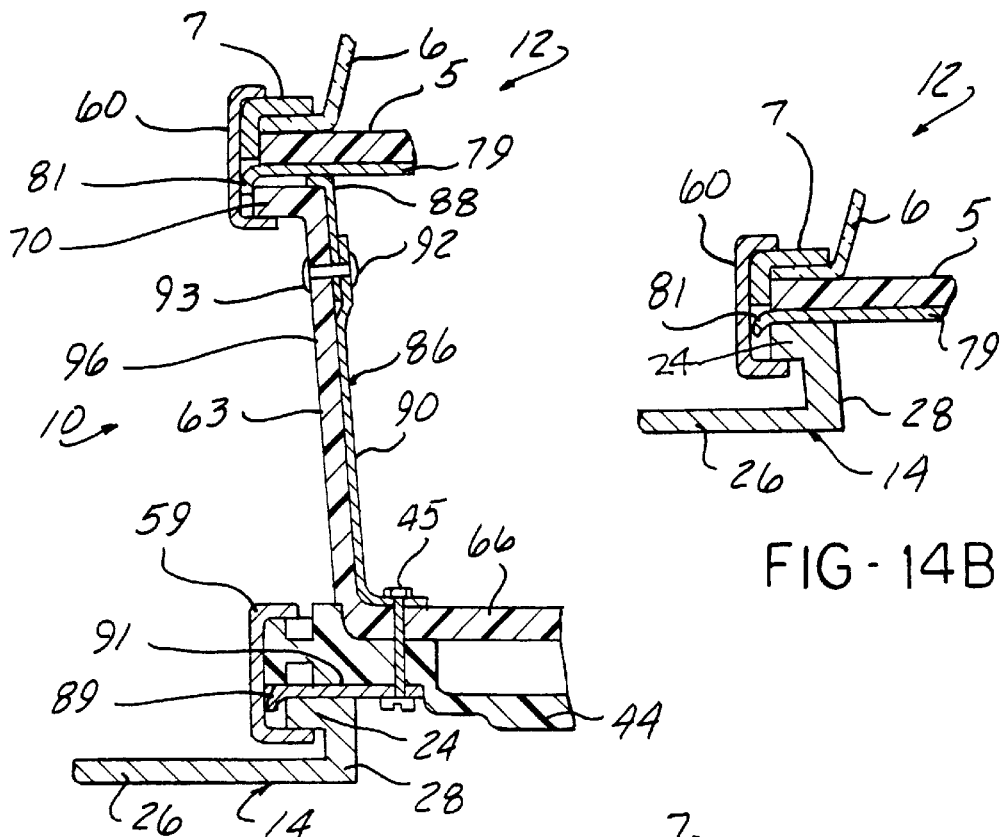
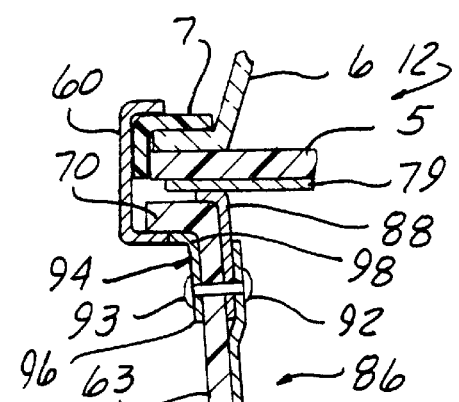
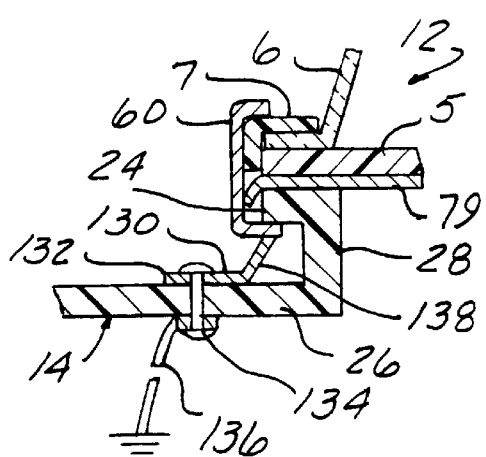
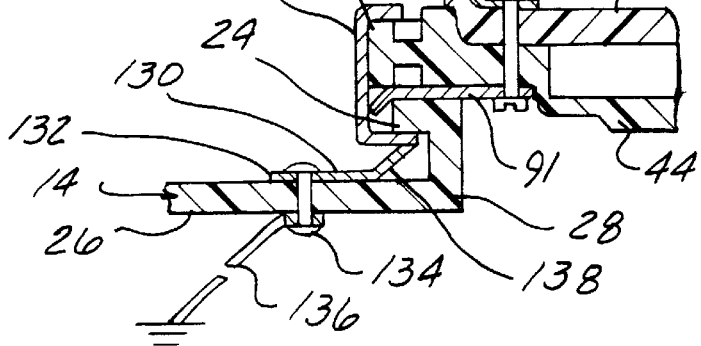

APPARATUS FOR GROUNDING EXTERNAL METAL WATTHOUR METER COMPONENT

CROSS REFERENCE TO RELATED APPLICATION

This application is a division of application Ser. No. 08/611,933 filed on Mar. 6, 1996, now U.S. Pat. No. 5,704,804.

This application describes an improvement to subject matter which is described in a related application Ser. No. 08/521,009 filed Aug. 30, 1995, now U.S. Pat. No. 5,577,933, issued Nov. 26, 1996, which is a continuation of application Ser. No. 08/215,915, filed Mar. 22, 1994, now abandoned, both in the name of Darrell Robinson et al, and entitled "WATTHOUR MOUNTING APPARATUS WITH SAFETY SHIELD".

BACKGROUND OF THE INVENTION

1. Field of the Invention

The present invention relates, in general, to electrical watthour meters and, specifically, to watthour meter mounting apparatus and, more specifically, to watthour meter socket adapters.

2. Description of the Art

In the electric utility industry, plug-in, socket-type watthour meters are commonly employed to measure electrical power consumption in a residential or commercial building establishment. A cabinet or housing is typically mounted on a outside wall of the residence or building and contains a meter socket having pairs of line and load terminals which are connected to electric power line conductors extending from the utility power network and electric conductors connected to the residential or building establishment power distribution network.

S-type, socket-type, plug-in watthour meters have replaced older A base bottom connected meters which were formed of a single piece housing in which the watthour meter was fixedly mounted along with compression terminals which provided connection to the utility power line conductor and the building load distribution conductors. In an installation involving an A-type bottom connected meter, an A to S socket adapter is used to allow a new S-type watthour meter to be installed. The S or socket type watthour meter has outwardly extending blade terminals which are insertable into jaw contacts mounted in an A to S-type meter socket adapter. Bottom mounted terminals on the socket adapter provide electrical connections between contacts mounted on the socket adapter and the line and load conductors in the meter socket. A sealing ring is mounted about an end mounting flange on the socket adapter and a mating mounting flange on a watthour meter to lockably mount the watthour meter to the socket adapter.

Plug-in socket adapters and socket adapters/extenders, both hereafter referred to simply as socket adapters, are designed with outward extending blade terminals to plug into the meter socket housing jaw contacts. Such socket adapters are employed to convert ringless style sockets to ring style sockets or to extend the mounting position of the jaw terminals in the socket housing outward from the socket housing for mounting various electrical equipment, such as test devices or survey recorders, in the socket housing.

Such socket adapters employ a generally annular base having a shell joined thereto and extending outward from one side of the base. Contacts are mounted in the shell and base. Each contact has a female jaw portion disposed interiorly within the shell and a male blade terminal connected to the female jaw portion and extending outward through the base for a plug-in connection to the terminals in the meter socket housing.

Such socket adapters may be employed in both ring style and ringless style socket housings. In a ring style housing, a raised mounting flange is formed on the front cover of the socket housing to which the peripheral edge of the base of the socket adapter mates and is locked thereto by means of a conventional, annular, lockable sealing ring. In a ringless style socket housing, the peripheral edge flange of the base of the socket adapter is disposed interiorly within the socket housing in close proximity to or engagement with a raised annular portion of the cover surrounding an aperture through which the shell portion of the socket adapter extends. In both ringless and ring style socket housings, a separate sealing ring is mounted about a end mounting flange at the outer end of the shell to lockably mount a watthour meter to the socket adapter.

In both bottom connected A to S type adapters as well as S-type socket extenders/adapters, a surge ground conductor is mounted on the meter mounting flange of the socket adapter to engage a ground tab on the base of the watthour meter when the watthour meter is coupled to the socket adapter. A separate wire conductor is connected to the surge ground conductor and passes through the base of the socket adapter to a ground connection in the meter socket. In other types of socket adapters, a rigid connector strap is connected to the surge ground conductor mounted on the meter mounting flange and extends to the base of the socket adapter where it is connected to the base of the socket adapter by a metal fastener. The fastener extends through the base of the socket adapter housing and serves as a mount for a metal tab. The metal tab is positioned exteriorly of the base of the socket adapter housing as in an S-type meter base and engages a corresponding ground contact or connection in the meter socket when the socket adapter is mounted in the meter socket.

Both types of surge ground circuits effectively ground the internal circuits of a watthour meter to the socket ground. However, watthour meters have a metal cover ring mounted about the periphery of the meter base. The cover ring is engaged by the sealing ring used to fixedly mount the watthour meter to the socket adapter, but is otherwise ungrounded since the socket adapter housing spaces the covering and the sealing ring from the meter socket cover which would normally make ground contact with the sealing ring to provide a safe equipment ground to all exposed metal. When an A base meter is used, the terminal access cover is sealed to the metal housing of the meter and provides a ground to the metal seal and cover. In an A to S meter adapter, this seal is attached to a plastic housing and is not grounded.

Present watthour meter construction utilizes a number of external wires which extend outward from the watthour meter for connection to telephone communication circuits, pulse counters, etc., in the socket housing or in external housings. If the wire is pinched or cut, it may contact the watthour meter cover ring, sealing ring and/or security seal thereby placing a voltage on the meter cover ring, sealing ring, and/or security seal which poses a significant safety problem.

Thus, it would be desirable to devise a means for grounding a watthour meter cover ring, sealing ring and/or security seal when the watthour meter is mounted in a meter socket. It would also be desirable to provide an apparatus which would easily and automatically ground a watthour meter cover ring, sealing ring and/or security seal. Finally, it would be desirable to provide a watthour meter socket adapter which automatically grounds a watthour meter cover ring, sealing ring and/or security seal during mounting of a watthour meter to the socket adapter and the mounting of the socket adapter in a meter socket.

SUMMARY OF THE INVENTION

The present invention is a watthour meter mounting apparatus which connects an external metal cover ring on a watthour meter and a sealing ring to ground in a watthour meter socket which receives a watthour meter socket adapter.

In one embodiment, the apparatus includes a watthour meter socket adapter having a housing supporting a plurality of electrical jaw contacts receiving blade terminals of a watthour meter in a plug-in electrical connection, and a plurality of blade terminals connected to the jaw contacts and extending outward from the housing for releasable insertion into jaw contacts in a watthour meter socket. A mounting flange is formed on the socket adapter housing. A metallic sealing ring is releasably mountable about the mounting flange on the socket adapter housing and a mating mounting flange on a watthour meter carrying an external metal cover ring when the watthour meter is mounted on the socket adapter. A surge ground conductor is mounted in the socket adapter housing. Ground means, mounted on the socket adapter housing, form an electrical path between the metallic sealing ring, the watthour meter cover ring and a ground connection in the watthour meter socket when the watthour meter is mounted on the socket adapter housing and the socket adapter housing along with a metallic sealing ring is mounted in a watthour meter socket.

Preferably, the ground means includes a first metal fastener which mounts the surge ground conductor to the socket adapter housing. The first fastener has an end positioned externally of the socket adapter housing to support a first electrically conductive tab exteriorly of the housing. The first tab has an end engagable with the sealing ring when the sealing ring is disposed about the mounting flange on the socket adapter housing and the metal cover ring on a mating mounting flange on a watthour meter. Further, the ground means includes a second metal fastener which mounts an opposed end of the surge ground conductor to the socket adapter housing. The second metal fastener also has an end extending exteriorly of the socket adapter housing to support a second electrically conductive tab which engages a ground connection in a meter socket, such as a socket cover, when the socket adapter is mounted in the meter socket.

In this embodiment, the surge ground conductor is formed of a first conductive member mounted on the mounting flange of the socket adapter housing and a second member connected by the first fastener to the first member and extending interiorly within the socket adapter housing. The second fastener extends through one end of the second member.

The surge ground conductor may be formed with a first conductive portion or member disposed on the mounting flange of the socket adapter housing. At least one and preferably a pair of tabs extend angularly outward from the first conductive member and seat in notches formed in the mounting flange. The top surface and bottom surface of the tabs are exposed through the mounting flange to enable contact between the tabs and a sealing ring and/or ground tab on a watthour meter when a watthour meter and sealing ring are mounted on the socket adapter housing. The first conductive member is connected by a second conductive member or strap to a ground connection externally of the socket adapter housing, as described above.

In another embodiment, a ground terminal mounted in a standard position on the base of a watthour meter is elongated in length such that an outer end is engageable with the sealing ring mounted about the mating mounting flanges of the watthour meter and the socket adapter housing to electrically connect the meter ground terminal to the sealing ring. This embodiment is usable with either a conductive or non-conductive watthour meter cover ring. The same ground connection through the surge ground conductor and fastener is used with the first sealing ring as described above. Further, the elongated meter base terminal can be used to electrically ground the sealing ring to a conductive grounded meter socket cover in a watthour meter/meter socket application without a socket adapter since it contacts both the sealing ring and the mounting flange of the watthour meter socket cover.

In another embodiment suitable for use with a non-conductive watthour meter socket cover, a conductive tab is mounted by means of a metal fastener on the non-conductive cover of the watthour meter socket. One end of the tab is disposed for engagement with a second sealing ring mounted about a base mounting flange on the watthour meter socket adapter and a mounting flange on the watthour meter socket cover. An electrical conductor is connected at one end to the metal fastener and at another end to a ground connection within the watthour meter socket to electrically complete a ground path for the second sealing ring to electrical ground in the watthour meter socket. The ground tab on the watthour meter socket adapter housing is elongated to engage the sealing ring and ground the surge ground conductor and both sealing rings.

Alternately, the same conductive tab, fastener and ground conductor can be used without a watthour meter socket adapter to electrically ground a watthour meter mounting sealing ring despite the presence of a non-conductive watthour meter socket cover.

In a second embodiment, the watthour meter socket adapter includes a watthour meter receiving portion and a terminal portion spaced from the watthour meter receiving portion. The plurality of electrical contacts are mounted in the watthour meter receiving portion of the housing, each receiving one blade terminal of a watthour meter in a snap-in connection. A plurality of electrical terminals are disposed in the terminal portion of the housing and receive one of an external electrical power line conductor and an electrical load conductor connected to an external load. An electrical conductor is connected to and extends between one contact and one terminal in the housing.

The watthour meter receiving means includes a base and an annular sidewall extending from the base. The ground means includes a surge ground conductor in the form of an annular metallic ring mounted in the watthour meter receiving portion adjacent an inner surface of the annular sidewall. The annular metallic ring has an angular discontinuity formed between first and second spaced ends. An aperture is formed in each of the first and second ends of the annular metallic ring. A metallic tubular sleeve is mounted on and extends from each of the first and second ends of the annular metallic ring. Each tubular sleeve has an internally threaded bore alignable with the aperture in the first and second ends of the annular metallic ring. Through bores are formed in the housing, with each bore receiving a sleeve of the annular metallic ring. Metallic fasteners are insertable through the bores in the housing into threaded engagement with the bores in the sleeves to mount the annular metallic ring to the housing.

In an alternate embodiment, a flange extends outward from one of the first and second ends of the annular metallic ring. The flange is located in proximity with the sealing ring mountable about the mating mounting flanges on the watthour meter socket adapter housing and on the watthour meter having the metal cover ring disposed exteriorly thereon. An aperture is formed in the flange and receives a wire seal passable therethrough and engagable with a sealing aperture in the sealing ring to electrically connect the metal cover ring on the watthour meter and the sealing ring to the surge ground conductor.

An additional metallic tubular sleeve is mounted at a top central portion of the annular metallic ring intermediate the first and second ends thereof. The tubular sleeve extends through a bore formed in the housing when the annular metallic ring is mounted in the housing and receives a metal fastener extendable through the housing into threaded engagement with the tubular sleeve to join the annular metallic ring to the housing. A metal hanger is interposed between the fastener and the housing and is secured to the housing by the fastener. The hanger provides a mount for mounting the socket adapter housing to a wall or other support surface and may provide a part of the ground connection between the annular ring and a meter service entrance box if the support surface is metallic ground.

In all embodiments of the present invention, the socket adapter provides a unique ground connection between an external metal cover ring on a watthour meter, a sealing ring and ground. This ground connection is formed automatically in the first embodiment when a watthour meter is mounted with the metallic sealing ring on the watthour meter socket adapter and the socket adapter is mounted in the meter socket. In the second embodiment, the ground connection is automatically formed through the sealing ring and security seal. Further, the ground connection, in both embodiments of the present invention, is obtained without major modification to existing socket adapter designs and thereby may be easily implemented at a low cost in conventional watthour meter socket adapters.

BRIEF DESCRIPTION OF THE DRAWINGS

The various features, advantages and other uses of the present invention will become more apparent by referring to the following detailed description and drawing in which:

FIG. 7 is a cross sectional view generally taken along line 7—7 in FIG. 5;

FIG. 8 is a cross sectional view generally taken along line 8—8 in FIG. 5;

FIG. 11 is a perspective view of a watthour meter socket adapter having an alternate embodiment of a surge ground conductor mounted thereon;

FIG. 12 is a cross sectional view generally taken along line 12—12 in FIG. 11;

FIG. 13 is an enlarged perspective view of the surge ground conductor shown in FIGS. 11 and 12;

FIG. 14A is a cross sectional view, similar to FIG. 2; but showing another embodiment of the present invention;

FIG. 14B is a partial, cross sectional view similar to FIG. 14A; but showing the use of the embodiment of FIG. 14A without a socket adapter;

FIG. 15A is a cross sectional view similar to FIG. 2; but showing yet another embodiment of the present invention; and FIG. 15B is a cross sectional view similar to FIG. 15A; but showing the use of the embodiment of FIG. 15A without a socket adapter.

DESCRIPTION OF THE PREFERRED EMBODIMENTS

Figure 1:
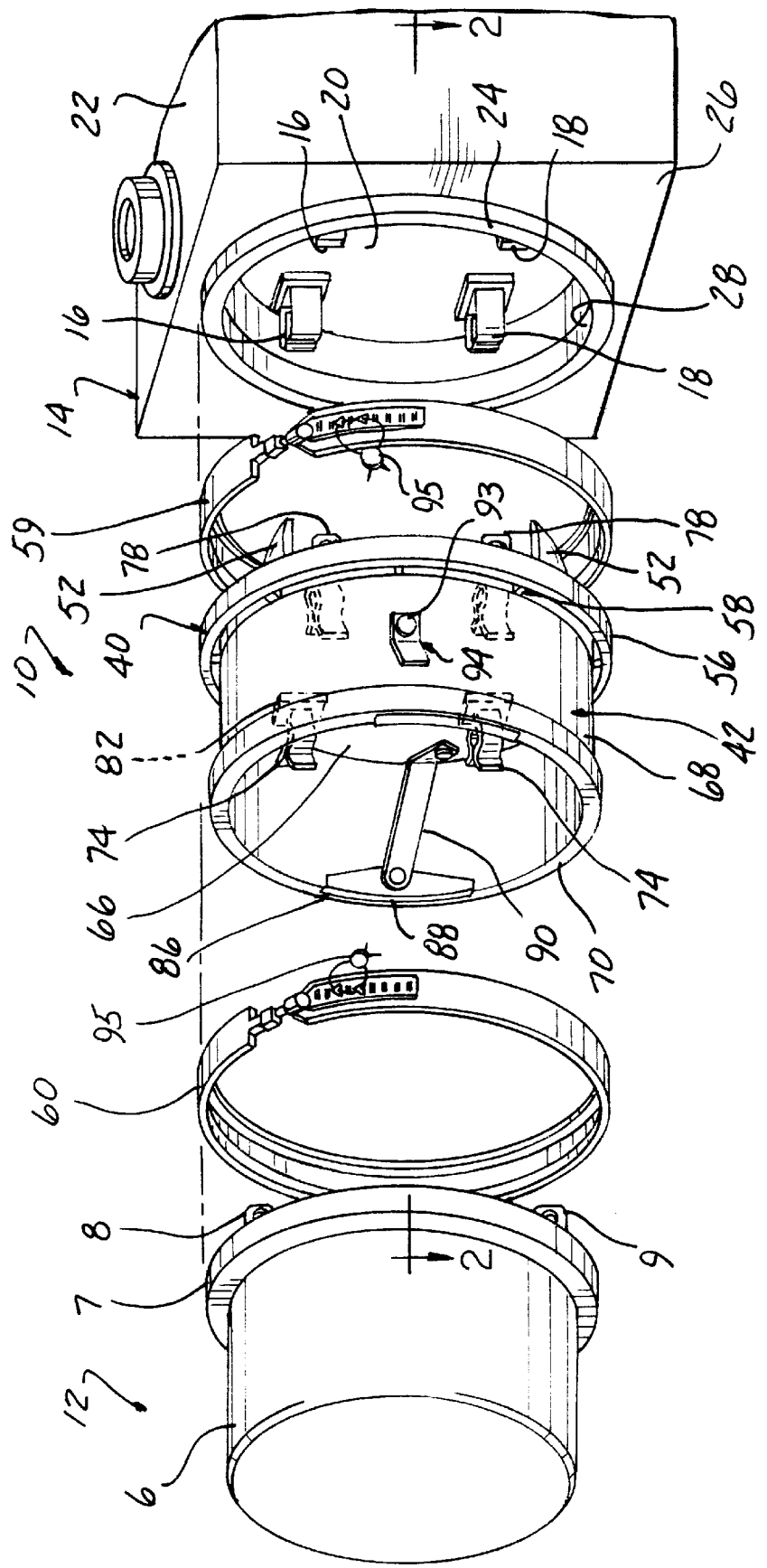
FIG. 1 is an exploded, perspective view of a first embodiment of a watthour meter socket adapter constructed in accordance with the teachings of the present invention.
Figure 2:
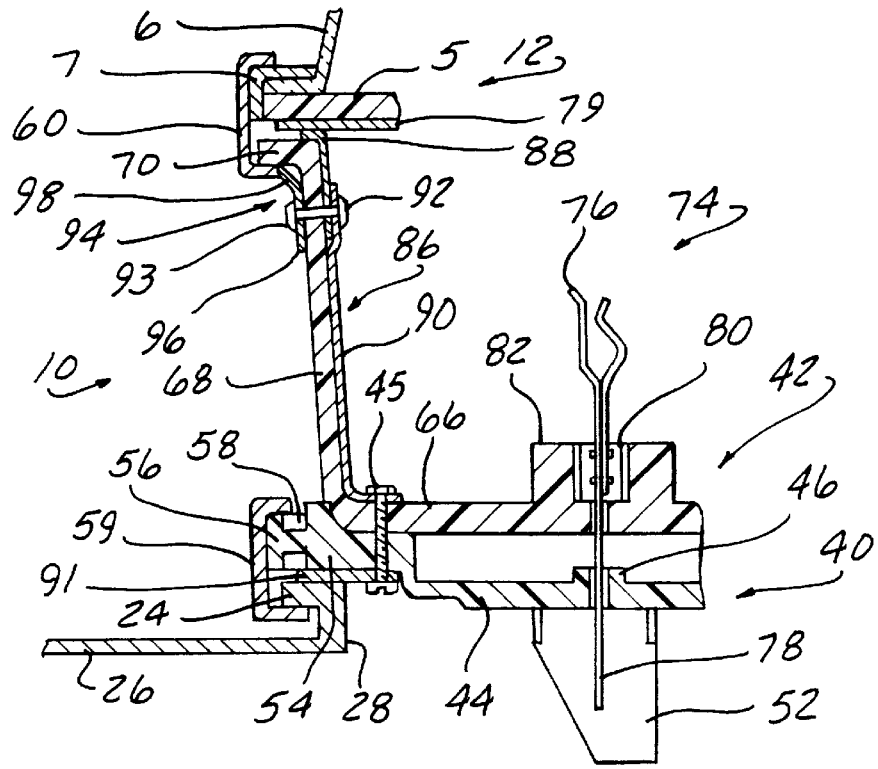
FIG. 2 is a cross sectional view generally taken along line 2—2 in FIG. 1 with the watthour meter, sealing ring and watthour meter socket adapter depicted in their assembled positions.

In order to better describe and appreciate the advantages of the present invention, a description of the conventional construction of an electric watthour meter socket adapter or socket extender/adapter, both hereafter referred to as a socket adapter, as well as a watthour meter and meter socket, will be provided with reference to FIGS. 1 and 2. A conventional watthour meter socket adapter 10, is designed to receive a conventional electric watthour meter 12 in a snap-in connection via mating contacts. As is conventional, the watthour meter 12 has a glass dome 6 surrounding the internal meter components. The meter dome 6 seats on a base 5 having a peripheral mounting flange surrounded by a metal meter cover ring 7 which aids in securing the glass dome 6 to the meter base 5. Pairs of line and load blade terminals 8 and 9, only one of each pair being shown for the single phase watthour meter 12 depicted in FIG. 1, extend outwardly from the base 5.

The socket adapter 10 also includes contacts which plug into mating contacts in a watthour meter socket 14. The number of contacts on the socket adapter 10, the watthour meter 12 and the socket 14 will vary depending upon the type of electric service at a particular user site. FIG. 1 depicts, by way of example only, a single phase electric service in which the meter socket 14 includes two pairs of contacts 16 and 18. The pair of contacts 16 are connected to the electric power line conductors; while the pair of contacts 18 are load contacts which are connected to the user site electrical distribution circuit. The pairs of contacts 16 and 18 in the socket 14 are fixedly mounted on a back wall 20 of a conventional socket housing 22. The housing 22 shown in FIGS. 1 and 2 is a ring-style housing in which a raised mounting flange 24 is formed on the front cover 26 of the socket housing 22 and spaced a short distance from the surface of the cover 26. The mounting flange 24 surrounds an aperture 28 through which the socket adapter 10 is removably disposed, as described hereafter. The socket adapter 10 may also be mounted in a socket having a ringless style cover, not shown, in which a raised annulus surrounds an aperture in the socket cover.

The socket adapter 10 is designed to interconnect the line contacts 16 in the socket 14 with the line blade terminals 8 on the watthour meter 12 and to connect the load blade terminals 9 on the watthour meter 12 with the load contacts 18 in the socket 14 to complete an electric circuit through the watthour meter 12 between the line and load power conductors in the socket 14.

As shown in FIGS. 1 and 2, the socket adapter 10 includes a base portion 40 and a shell portion 42 which are fixedly joined together by suitable means, such as by fasteners 45. The base 40 has a central wall 44 of generally circular shape. A plurality of generally rectangular projections 46 are formed on the wall 44, each of which has a slot formed therein which extends completely through each projection 46 and the wall 44 to receive a blade terminal therethrough, as described hereafter. A plurality of outwardly extending legs 52 are formed on a back surface of the wall 44 and are provided in an appropriate number and are spaced from one of the blade terminals which extends through the base 40.

An annular raised inner peripheral edge flange 54 is formed on the base 40 and extends outward from one surface of the central wall 44. An outer peripheral edge flange 56 is spaced radially outward from the inner flange 54. A plurality of circumferentially spaced ribs 58 are formed on the base 40 and extend radially between the inner and outer peripheral edge flanges 54 and 56.

The inner peripheral edge flange 54 on the base 40 forms a seat for receiving a peripheral edge portion of the shell 42 when the shell 42 is mounted on the base 40. The outer peripheral edge flange 56 extends radially outward from the inner edge flange 54 and forms a mounting flange which mates with the mounting flange 24 on the ring-style cover 26 of the socket 14 shown in FIGS. 1 and 2. A conventional sealing ring 59, which may be a sealing ring sold by Ekstrom Industries, Inc., Farmington Hills, Mich., Model Number 10-9030, is employed to surround and lockingly join the outer peripheral edge flange 56 of the base 40 to the mounting flange 24 on the socket 14.

The shell 42 of the socket adapter 10 is formed with a bottom wall 66 and a generally annular sidewall 68 which tapers outwardly from one side of the bottom wall 66. The sidewall 68 terminates in an enlarged diameter, radially outward extending, exterior end mounting flange 70. The mounting flange 70 is designed to mate with a corresponding mounting flange formed by the base 5 and the cover ring 7 of the watthour meter 12. A sealing ring 60, similar to that described above, may be employed to encompass and lockingly engage the mounting flange 70 on the shell 42 and the cover ring 7 on the watthour meter 12.

A plurality of contacts denoted generally by reference number 74 are mounted in the shell 42. The contacts 74 may be provided in any number or type depending upon the type of electrical service provided to a particular user site. Each contact 74 has a female jaw portion 76 designed to receive a blade terminal 8 or 9 of the watthour meter 12 therein in a plug-in, snap-together connection. The opposite end of each contact 74 is formed as a male-type blade terminal 78 which extends through apertures 80 formed in raised bases 82 on the bottom wall 66 of the shell 42 as shown in FIG. 2. Each blade terminal 78 further extends through the slots in the projection 46 in the wall 44 of the base 40 and plugs into one of the contacts 16 and 18 in the socket 14.

A pair of ground conductors 86 are mounted on opposite sides of the shell 42 to provide a ground connection to the electric high voltage surge suppression circuit of the watthour meter 12 via contact with a terminal 79 on the base of the watthour meter 12. Each ground conductor 86 has a peripheral edge portion or strap 88 mounted on and extending over an edge of the end mounting flange 70. A connector strap 90 is joined to the strap 88 and extends along the sidewall 68 of the shell 42 to the bottom wall 66 of the shell 42 where it is engaged by fastener 45 used to mount shell 42 to base 40. A ground tab 91 is mounted about the fastener 45, external of the central wall 44 of the base 40, and contacts the metal flange 24 on the cover 26 of the meter socket 14.

A suitable fastener, such as a rivet 92, is employed to join the connector strap 90 to the edge strap 88 and to mount the straps 88 and 90 to the upper end of the sidewall 68. One end 93 of the rivet 92 extends exteriorly of the sidewall 68 of the shell 42 as shown in FIGS. 1 and 2.

It will be understood that the strap 88 and the connector strap 90 could be integrally formed as a one-piece, unitary member which is bent into the form shown in FIGS. 1 and 2.

The present socket adapter 10 is provided with a unique means for connecting a watthour meter cover ring 7 and the sealing ring 60 to ground in the watthour meter socket 14. As shown in FIGS. 1 and 2, a metal spring tab 94 is mounted exteriorly of the sidewall 68 of the shell 42 adjacent the end mounting flange 70. The spring tab 94 has a planar first end 96 with an aperture formed therein for receiving the end 93 of the rivet 92 therethrough to mount the spring tab 94 adjacent to the exterior surface of the sidewall 68 of the shell 42. A radially outward extending, angularly disposed second end 98 is formed on the spring tab 94 and is located immediately adjacent the end mounting flange 70.

In use, after the socket adapter 10 has been mounted in the socket 14 via a plug-in connection between the blade terminals 78 on the socket adapter 10 and the jaw contacts 16 and 18 in the socket 14, the watthour 12 is similarly mounted to the socket adapter 10 via a plug-in connection between the blade terminals 8 and 9 on the watthour meter 12 and the jaw contacts 74 in the socket adapter 10. Alternately, the meter 12 could be plugged into the socket adapter 10 before the adapter 10 is plugged into the meter socket 14. The metal sealing ring 60 is then mounted about the cover ring 7 on the base 5 of the watthour meter 12 and the mounting flange 70 on the shell 42 of the socket adapter 10 to lockingly couple the watthour meter 12 to the socket adapter 10. A padlock or wire seal 95 is then placed through the interconnected ends of the sealing ring 60 to lock the ends of the sealing ring 60 together and to provide a visible indication of tampering with the sealing ring 60.

As shown in FIG. 2, one end of the sealing ring 60 contacts the second end 98 of the spring tab 94 when the sealing ring 60 is mounted about the mating mounting flanges on the watthour meter 12 and the socket adapter 10. At the same time, the sealing ring 60 contacts the external cover ring 7 on the watthour meter 12. This forms a ground connection path extending from the external cover ring 7 on the watthour meter 12, the sealing ring 60, the spring tab 94, the rivet 92, the ground conductor 86, the metal fastener 45 and the contact tab 91 to a ground connection with the metal cover 26 of the meter socket 14. This effectively grounds the external cover ring 7 on the watthour meter 12 and the sealing ring 60.

FIG. 14A depicts a modification to the embodiment shown in FIGS. 1 and 2. This embodiment is substantially identical to that described above and shown in FIGS. 1 and 2 with two modifications. As shown in FIG. 14, the outer end 81 of the meter base terminal 79 extends radially outward a sufficient distance to engage the first sealing ring 60 when the meter 12 is mounted on the socket adapter 10 and the first sealing ring 60 is engaged about the mating mounting flanges of the watthour meter 12 and the socket adapter 10. This engagement provides a conductive path between the meter base terminal 79, the metallic sealing ring 60, and the ground conductor 86 to ground as described above in the embodiment shown in FIGS. 1 and 2. It should be noted that the spring tab 94 is not required in this embodiment since the meter base terminal contacts both the sealing ring 60 and the ground conductor 86. Of course, the tab 94 could still be used, if desired, for a backup ground connection.

In a preferred version of this embodiment, the outer end 81 of the meter base terminal 79 is angled from the plane of the main portion of the terminal 79 so as to easily bend when the sealing ring 60 is mounted about the mating mounting flanges of the watthour meter 12 and the watthour meter socket adapter 10. This creates a spring force to the outer end 81 of the base terminal 79 which ensures good electrical contact between the base terminal 79 and the sealing ring 60.

As also shown in FIG. 14A, a similar arrangement is provided for the ground tab 91 on the base of the watthour meter socket adapter 10. The outer end 89 of the ground tab 91 is also extended radially outward a sufficient distance to engage the second sealing ring 59 used to couple the base mounting flange of the watthour meter socket adapter 10 to the mating mounting flange 24 on a ring-style watthour meter socket cover 26. Again, it is preferred that the outer end 89 of the ground tab 91 be angularly bent from the plane of the main portion of the ground tab 91 to provide a spring biasing force and secure electrical contact between the ground tab 91 and the sealing ring 59.

FIG. 14B depicts the same elongated meter base terminal 79; but in a watthour meter 12 and watthour meter socket 14 application without a watthour meter socket adapter 10. Here the meter base terminal 79 connects the sealing ring 60 to the grounded, metallic, watthour meter socket cover 26.

FIG. 15A depicts another embodiment of the present invention which again is substantially similar to the first embodiment described above and shown in FIGS. 1 and 2. In this embodiment, the cover ring 7 on the watthour meter 12 is formed of a non-conductive material, such as a suitable plastic. Further, the watthour meter socket cover 26 may also be formed of non-conductive material, such as a suitable plastic.

A ground connection is provided for the first sealing ring 60 and the second sealing ring 59 via the tab 94, ground conductor 86, fastener 45 and ground tab 91 as described above and shown in FIGS. 1 and 2. The watthour meter base terminal 79 is also grounded via contact with the ground conductor 86 mounted on the watthour meter socket adapter 10.

However, since the watthour meter socket cover 26 is formed of a non-electrically conductive material in this embodiment, a separate ground connection is provided for first and second sealing rings 60 and 59. This ground connection is implemented in an exemplary embodiment via an electrically conductive spring tab 130. The spring tab 130 has a first end portion 132 disposed in registry with a front surface of the cover 26 of the watthour meter socket and is fixedly connected to the front cover via a conductive fas-tener 134, such as a rivet. An electrical conductor 136 is connected to fastener 134 at one end and to a ground connection within the watthour meter socket at another end.

An opposite end 138 of the spring tab 130 is positioned to electrically contact the second sealing ring 59 when the sealing ring 59 is disposed about the mating mounting flanges of the watthour meter socket adapter 10 and the watthour meter socket cover 26. In a preferred embodiment, the end 138 is bent angularly from the plane of the main portion of the spring tab 130 so as to be biased into contact with the sealing ring 59. This arrangement provides a conductive path between the second sealing ring 59, the spring tab 130, the fastener 134 and electrical conductor 136 to an internal ground connection within the watthour meter socket. The first sealing ring 60 is connected to ground via the second sealing ring 59, the elongated tab 91, the fastener 45, the ground conductor 86 and the spring tab 94. The meter base terminal 79 is also grounded due to contact with the ground conductor 86 on the watthour meter socket adapter 10.

FIG. 15B depicts an alternate embodiment using the same ground connection shown in FIG. 15A which includes the spring tab 130, the fastener 134 and the conductor 136 in a watthour meter 12 and watthour meter socket 14 application without a watthour meter socket adapter 10. In this application, the socket cover 26 is non-conductive as in FIG. 15A.

Referring now to FIGS. 11–13, there is depicted an alternate embodiment of a ground means for use in the socket adapter 10 described above and shown in FIGS. 1 and 2. In FIG. 11, like reference numbers are used to refer to the same elements of the socket adapter 10 as described above and shown in FIG. 1.

As shown in FIG. 11, at least one pair and preferably two pair of slots 100 are formed in the mounting flange 70 of the watthour meter socket adapter 10. The slots in each pair of slots 100 are spaced apart on the mounting flange 70 and extend from an inner edge of the mounting flange at the juncture with the inner surface of the side wall 68 of the shell 42 to a termination short of the peripheral edge of the mounting flange 70. In a preferred embodiment, two pairs of slots 100 are formed on the mounting flange 70, each pair generally diametrically opposed from the other pair as shown in FIG. 11.

At least one and preferably a pair of identical surge ground conductors 102 are disposed diametrically opposite each other on the mounting flange 70 and mounted in the slots 100. Each surge ground conductor 102 includes a first conductive portion or member 104 which has an upper edge 106 disposed generally in line with the mounting flange 70 and a depending wall 108 extending from the upper edge 106 and overlying an inner surface of the side wall 68 of the shell 42. The wall portion 108 has a generally arcuate shape to conform to the arcuate shape of the side wall 68 of the shell 42. An aperture 110 is formed in the wall 108 for receiving the fastener means, such as rivet 92, therethrough as described hereafter.

At least one and preferably a pair of tabs 112 and 114 are formed on the first conductive portion 104 and extend angularly, preferably perpendicularly, from the upper portion of the wall 108 as shown in FIGS. 12 and 13. The tabs 112 and 114 are preferably identical in form and have a generally planar shape extending perpendicularly from the wall portion 108. Each tab, such as tab 114, has an upper edge 116 and an opposed lower edge 118. A cutout or notch 120 is formed in each tab, such as tab 114, between the wall 108 and the lower edge 118 as shown in FIGS. 12 and 13. The notch 120 has a width selected to snugly conform about the upper portion of the side wall 68 of the shell 42 as shown in FIG. 12 to securely mount the first conductive portion 104 on the mounting flange 70 of the shell 42.

As shown in FIGS. 11 and 12, when the tabs 112 and 114 are mounted in one pair of slots 100 on the mounting flange 70, the notches 120 surroundingly engage the upper edge of the side wall 68. In this position, the upper edge 116 and the lower edge 118 of each tab 112 and 114 are exposed through the slot 100 in the mounting flange 70. This enables the upper edge 116 of each tab 112 and 114 to contact the terminal 79 on the base of a watthour meter mounted on the mounting flange 70. The lower edge 118 of each tab 112 and 114 also electrically contacts the sealing ring 60. This forms a ground path between the metal cover ring 7 on the watthour meter 12 through the sealing ring 60, the tabs 112 and 114 and the first conductive portion or member 104 of the surge ground conductor 102.

The remainder of the surge ground conductor 102 is identical to that described above. A suitable fastener, such as rivet 92, extends between overlapped portions of the first conductive portion 104 and the conductive strap 90 and, also, through the side wall 68 of the shell 42 to securely mount the surge ground conductor 102 to the shell 42. The bottom end of the second conductive portion or strap 90 extends to the bottom wall 66 of the shell for external connection to ground tab 91 as described above and shown in FIG. 2.

Referring now to FIGS. 3–12, there is depicted another embodiment of the present invention. In this embodiment, reference number 310 depicts a polyphase A to S watthour meter socket adapter. Further details concerning the construction and use of the adapter 310, not described herein, can be had by referring to U.S. application Ser. No. 08/521, 009 filed Aug. 30, 1995, the contents of which are incorporated herein by reference.

The adapter 310 is formed of a two-part housing including a rear housing 312 and a front housing 314. As shown in FIGS. 3, 4, 7 and 8, the rear housing 312 is formed with a planar base 316. An annular side wall 318 is integrally formed with and extends substantially perpendicularly from the base 316. The annular side wall 318 terminates in an angular discontinuity formed by side ends 320 and 322. Flanges 324 and 326 extend outward from the side ends 320 and 322, respectively, and are spaced therefrom to form mounting grooves for a rim filler described hereafter.

An annular rim 319 is formed at an outer edge of the annular side wall 318. Lower side walls 328 and 330 depend angularly from the side ends 320 and 322 of the side wall 318 to a bottom edge of the rear housing 312. A pair of hollow cylindrical members 332 are mounted integral with the lower side walls 328 and 330 to aid in aligning the front housing 314 to the rear housing 312.

In addition, a pair of spaced generally cylindrical members 334 and 336 of differing diameters are formed on the inside of each of the lower side walls 328 and 330 and form alignment, support and interlock surfaces for the front housing 314 as described hereafter.

Figure 3:
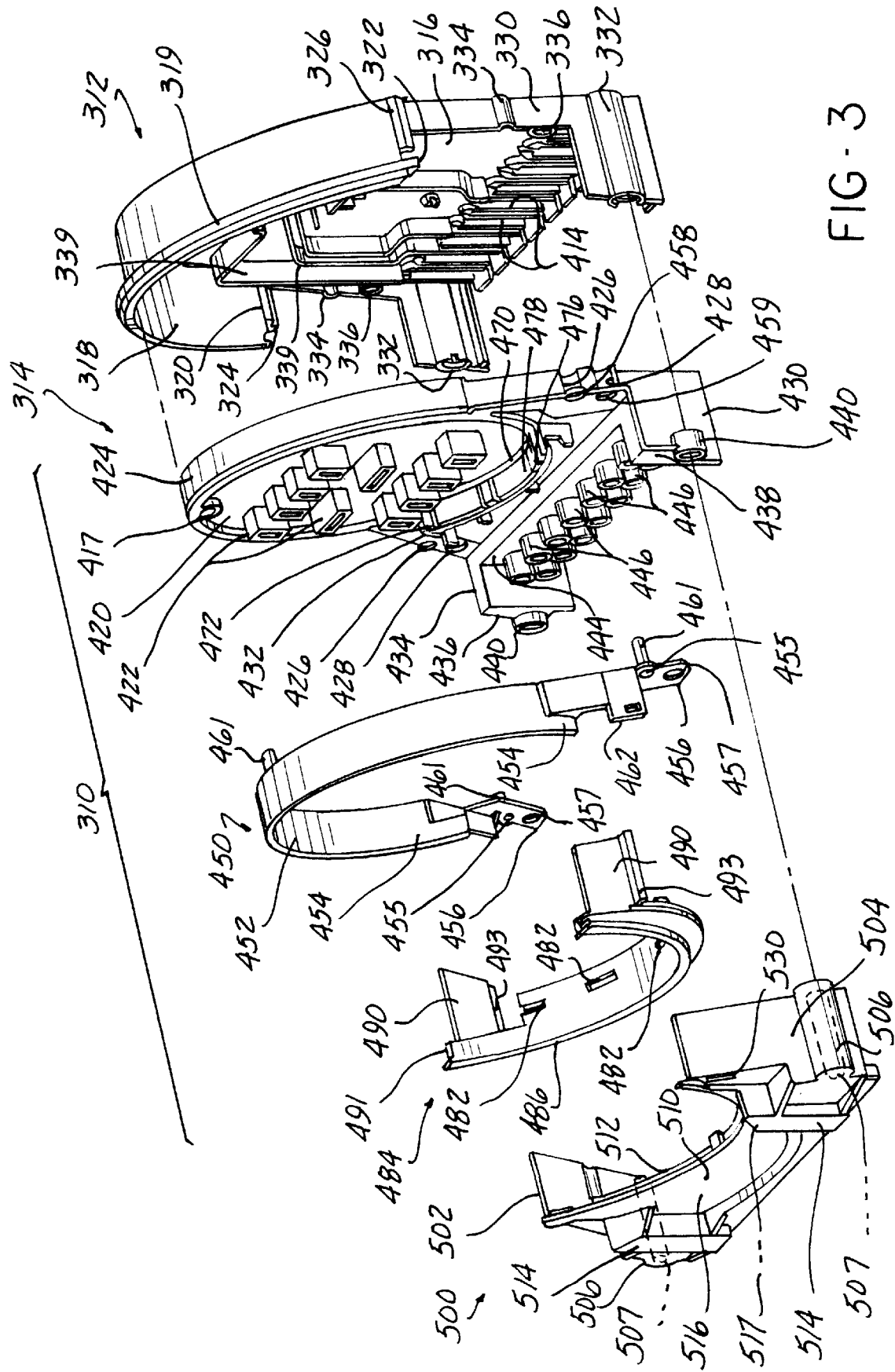
FIG. 3 is an exploded, perspective view of a second embodiment of a watthour meter socket adapter constructed in accordance with the teachings of the present invention.
Figure 4:
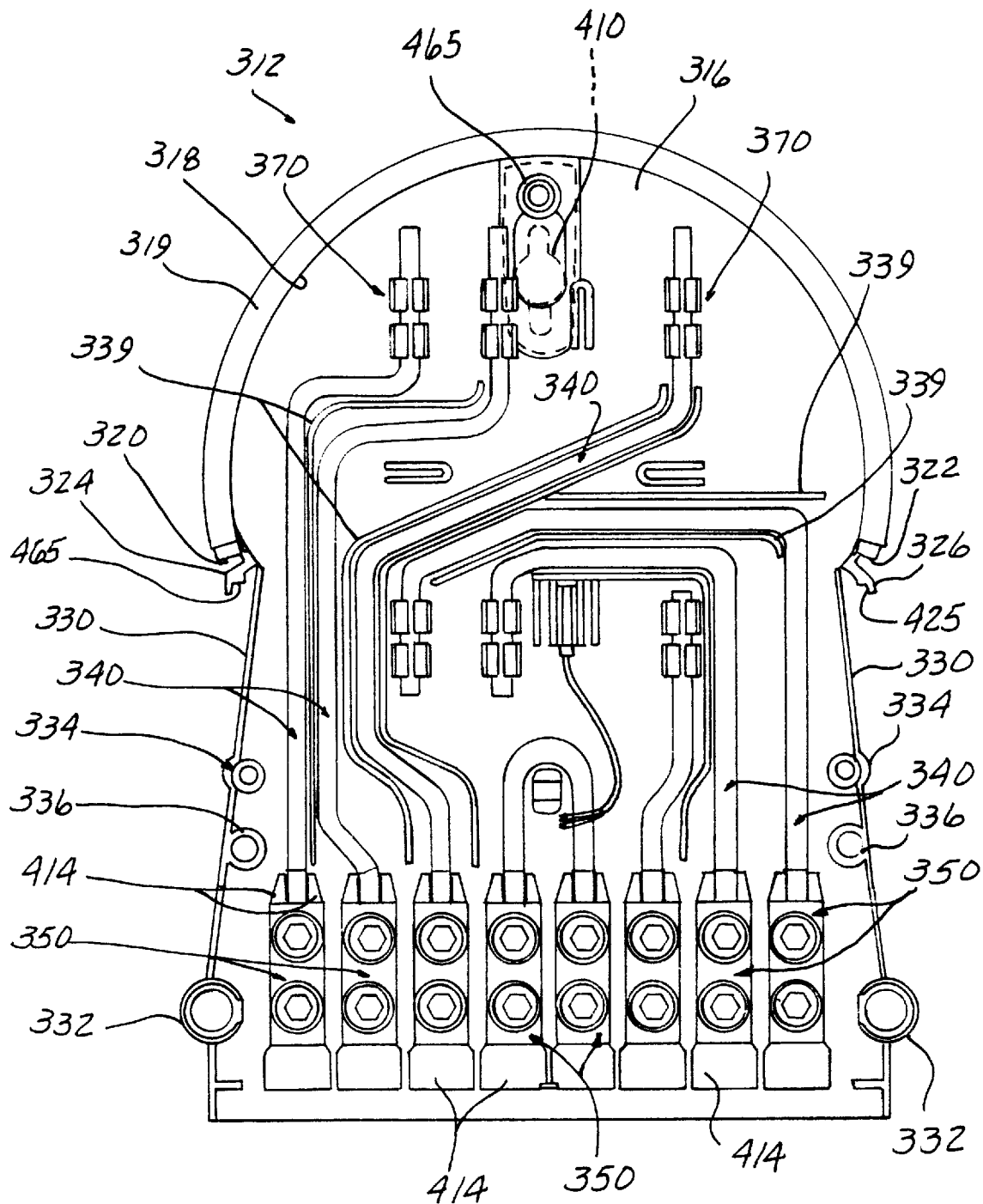
FIG. 4 is a front elevational view of the rear housing of the watthour meter socket adapter shown in FIG. 3 which also illustrates the electrical conductors, terminals and contacts mounted therein.

A plurality of spaced divider members all denoted generally by reference number 339 in FIGS. 3 and 4 are formed on the base 316 of the rear housing 312 and receive individual electrical conductors therebetween. The divider members 339 electrically insulate adjacent electrical conductors from each other. Although the dividers 339 are depicted as being formed completely on the base 316 of the rear housing 312, it will be understood that the dividers 339 may take other forms, such as being integrally formed on a rear surface of the front housing 314 or as complimentary, mating members individually formed on both of the front and rear housings 312 and 314.

Conductor terminal support surfaces 414 are formed in a lower portion of the base 316 for supporting electrical terminals thereon.

A metal hanger 410, shown in FIG. 7, is mounted on a rear surface of the base 316 for mounting the socket adapter 310 to a support surface in a conventional manner. A boss 412 with an internal bore 413 is formed on the base 316 for receiving a fastener 467 to attach the hanger 410 to base 316 of the rear housing 312 as described hereafter.

As shown in FIGS. 3, 5, 7 and 8, the front housing 314 is formed as a one-piece, integrally molded member of an electrically insulating material, such as a suitable plastic. The front housing 314 can be formed of a transparent plastic to enable the location and connections of the conductors disposed behind the front housing 314 to be easily viewed. The front housing 314 includes a generally circular shaped, planar base 420. A plurality of hollow pockets or receptacles 422 are integrally formed on and extend outward from one surface of the base 420. Each receptacle 422 is designed to receive a contact attached to an electrical conductor in and includes a slot for slidably receiving a blade terminal 8 or 9 of a watthour meter 12, as shown in FIG. 1, or other electrical apparatus inserted into the socket adapter 310.

An annular rim 424 extends from the base 420 of the front housing 314 and is engagable with the sidewall 318 and the flanges 324 and 326 formed at the ends 320 and 322, respectively, of the side wall 318 of the rear housing 312. In this position, the rim 424 overlays a portion of the lower side walls 328 and 330 of the rear housing 312. A pair of arcuate, generally cylindrical recesses 426 and 428 are formed in planar end portions of the rim 424 and are sized to matingly surround the cylindrical members 334 and 336 on the rear housing 312 to fixedly support and locate the front housing 314 relative to the rear housing 312. A lower side wall 430 extends from the lowermost recess 428 on each side of the first housing 314 to a bottom edge of the front housing 314.

A front cover filler 432 extends below the base 420 of the front housing 314 to a terminal block portion 434. The terminal block portion 434 extends outward from the front cover filler 432 and terminates in a pair of raised side walls 436 and 438 on opposite sides of the lower portion of the front housing 314. A pair of annular support members 440 are mounted in the side walls 436 and 438 and are alignable with the cylindrical bosses 332 in the rear housing 312 so as to receive mating and location pins 507 on a terminal cover 500 as described hereafter.

A plurality of aligned pairs of cylindrical, hollow tubular members 446 are mounted on the terminal mounting base 444 for providing access to the screw fasteners on the terminals mounted between the front and rear housings 314 and 312, as also described hereafter.

A surge ground conductor 450, shown in FIGS. 3 and 5–8, is mountable over the base 420 of the front housing 314 and is disposed within the annular side wall 318 of the rear housing 312 after the front housing 314 has been joined to the rear housing 312. The surge ground conductor 450 is in the form of an annular ring 452 which terminates at opposed ends in a pair of fingers 454. Also, a pair of depending flanges 456 extend from the opposite ends of the annular ring 452 and include apertures 455 and 457 which are alignable with apertures 458 and 459, respectively, on the front cover filler 432.

Figure 6:
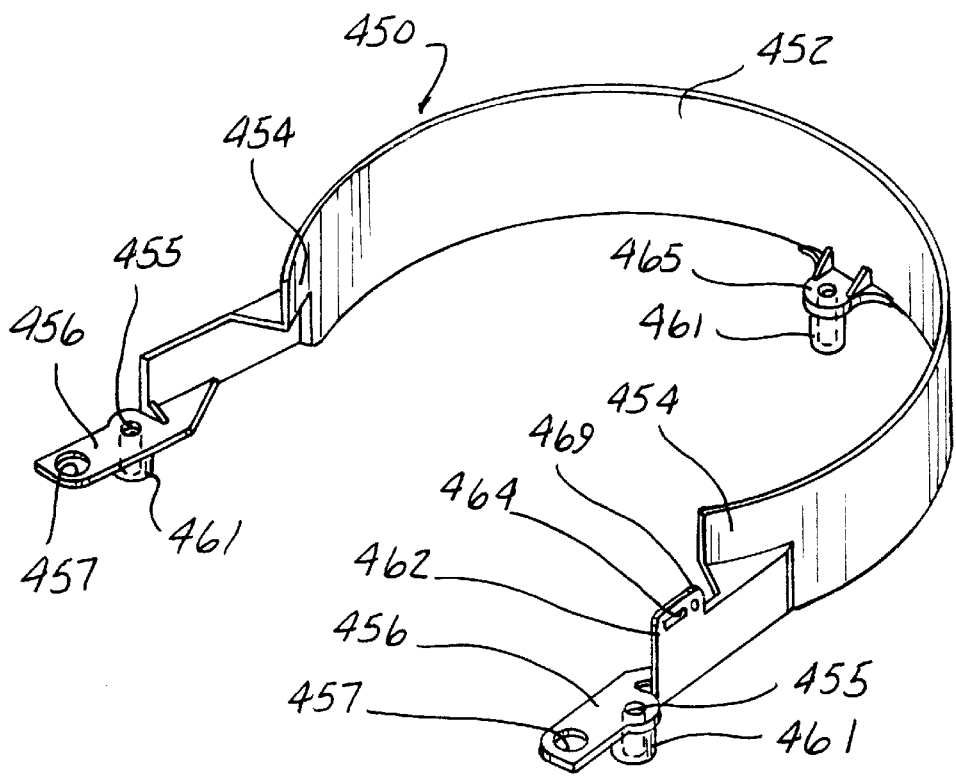
FIG. 6 is an enlarged, perspective view of the surge ground ring employed in the watthour socket adapter shown in FIGS. 3 and 5.

A tapped or internally threaded generally cylindrical sleeve 461 in integrally formed on each end flange 456 of the ring 452 and extends perpendicularly outward from a rear surface thereof. In addition, a depending apertured flange 465 is centrally formed at an upper portion of the annular ring 452 and has a similar threaded sleeve 461 extending therefrom as shown in FIGS. 6, 7 and 8 which is alignable with a bore 415 in a boss 417 in the top upper portion of the base 420 of the front housing 314 and the bore 413 in the boss 412 in the rear housing portion 312.

As shown in FIG. 7, the hanger 410 is mounted in a recess formed in the base 316 of the rear housing 312. An aperture in the hanger 410 is alignable with a bore 413 in the boss 412 formed on the base 316. The boss 417 depending from the top central portion of the base 420 of the front housing 314 fits over the boss 412 on the base 316 of the rear housing 312 and receives the sleeve 461 mounted at the top central portion of the annular ring 452. A fastener 467 is inserted through the aperture in the hanger 410 and through the rear of the base 316 and the bore 413 in the boss 412 into threaded engagement with the sleeve 461 on the surge ground conductor 450 to secure the surge ground conductor 450 to the front housing 314 as well as to assist in securing the front housing 314 to the rear housing 312.

Similarly, as shown in FIG. 8, the tubular sleeves 461 on each of the flanges 456 on the surge ground conductor 450 are insertable through the apertures 458 formed on the front housing 314. The internal threaded bore in the sleeve 461 is alignable with a corresponding bore formed in the cylindrical members 334 formed on the base 316 of the rear housing 312. A metallic fastener 467 is inserted through the rear of the base 316 into threaded engagement with the sleeve 461 to secure the end flanges 456 of the surge ground conductor 450 to the front housing 314 as well as to secure the front housing 314 to the rear housing 312.

Another fastener, not shown, is extendable through each lower aperture 457 in each mounting flange 456 on the annular ring 452 and an aperture 459 in the front housing 314 and through the cylindrical member 336 in the rear housing 312 to provide a means for mounting the socket adapter 310 to a wall or other support surface which may or may not be metallic ground.

As also shown in FIGS. 3, 6, 9 and 10, an outwardly extending flange 462 is formed on one depending flanges 456 of the surge ground conductor 450 and includes a slot 464 and an aperture 469.

Figure 5:
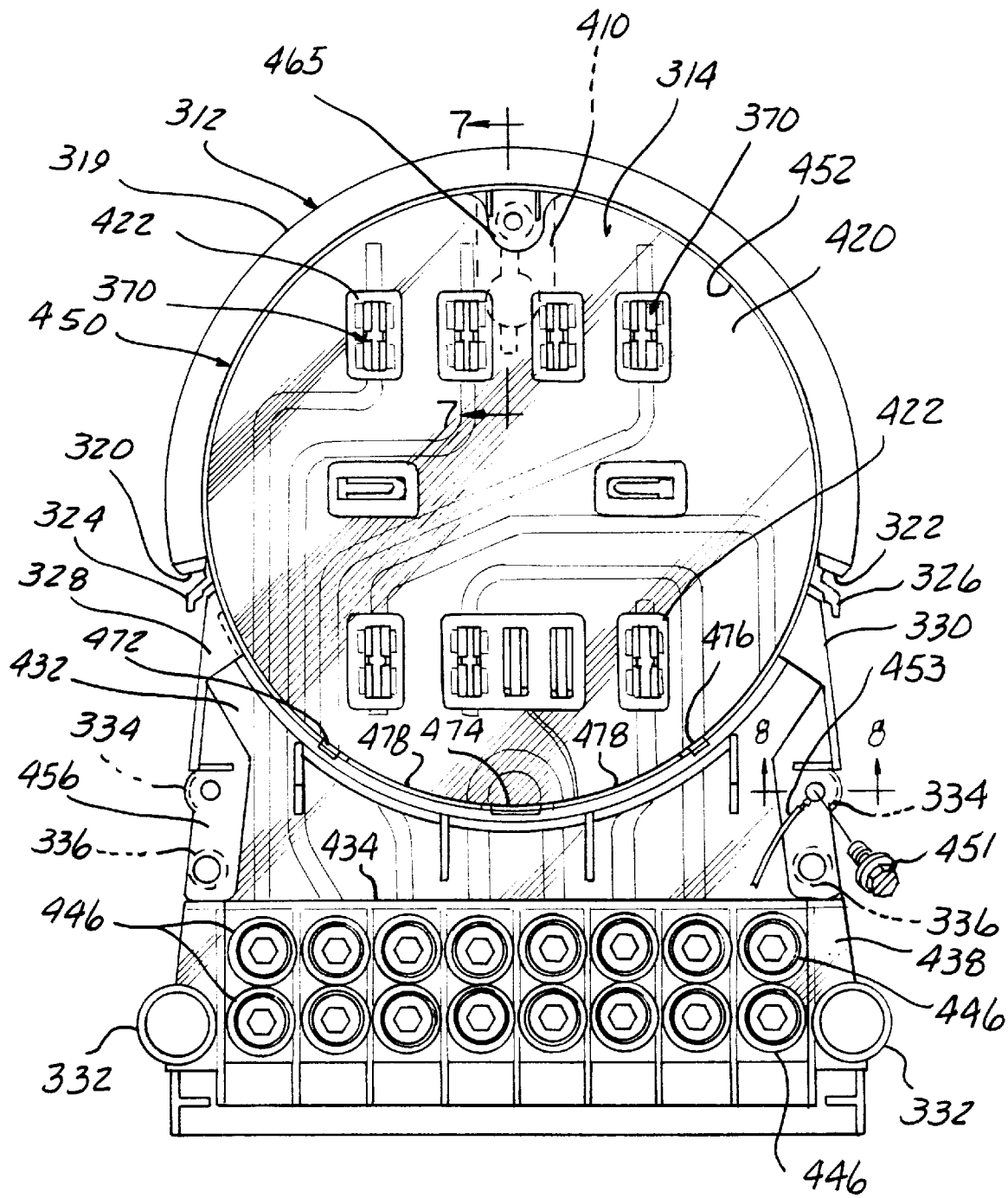
FIG. 5 is a front elevational view of the assembled watthour meter socket adapter shown in FIG. 3.
Figure 9:
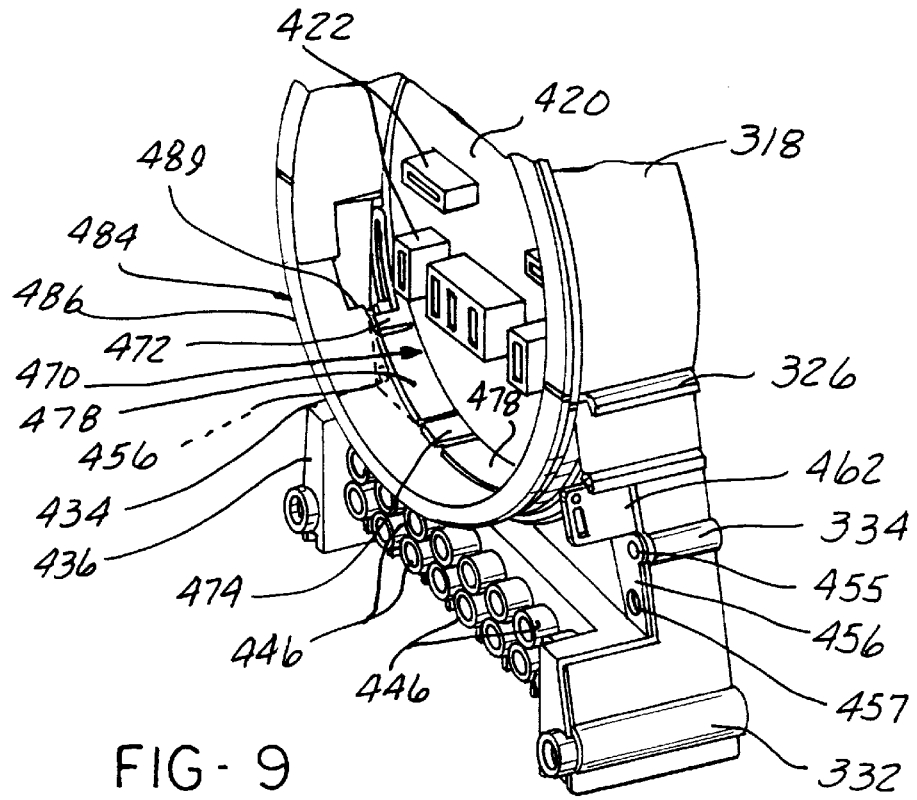
FIG. 9 is a partial, perspective view of a lower portion of the socket adapter shown in FIG. 3; but without a terminal cover mounted thereon.

As shown in FIG. 3, and in greater detail in FIGS. 5 and 9, a rim filler denoted generally by reference number 470 is formed on the base 420 of the front housing 314 and is positioned to fill the angular discontinuity between the side edges 320 and 322 of the annular side wall 318 of the rear housing 312 when the front housing 314 is mounted in the rear housing 312. The rim filler 470 extends substantially perpendicularly from a lower portion of the base 420 and includes a plurality of angularly spaced tabs 472, 474, and 476 which are angularly spaced apart by annular flanges 478.

Pointed flanges are formed on ends of the rim filler tabs 472, 474, and 476 to interlockingly mate with corresponding slots 482 formed on a rim filler extension 484. As shown in FIGS. 3 and 9, the rim filler extension 484 includes an arcuate portion 486 sized to mount below the rim filler 470. The plurality of slots 482 formed in the arcuate portion 486 interlockingly engage the tabs 472, 474 and 476 when the rim filler extension 484 is mounted on the rim filler 470. A pair of mounting arms 490 extend outward from opposite ends of the arcuate portion 486 and interlock with the flanges 324 and 326 of the rear housing 312 to align the rim filler extension 484 with the rear housing 312. The ends of the mounting arms 490 are formed with a narrow projection 493 which extends outward from each outer end of the mounting arms 490. Each projection 493 slidably engages a mating slot formed in each side end 320 and 322 of the annular side wall 318 of the rear housing portion 312.

Slots 489 formed between the rim filler 470 and the rim filler extension 484 are disposed adjacent to the base 420 of the front housing portion 314 and provide openings through which auxiliary wires connected to electronic circuits in a watthour meter mounted in the socket adapter 310 or from current terminals or other terminals mounted in the socket adapter 310 pass from the front housing 314 to the terminal portion, and from the terminal portion, as described hereafter, externally from the adapter 310.

Figure 10:
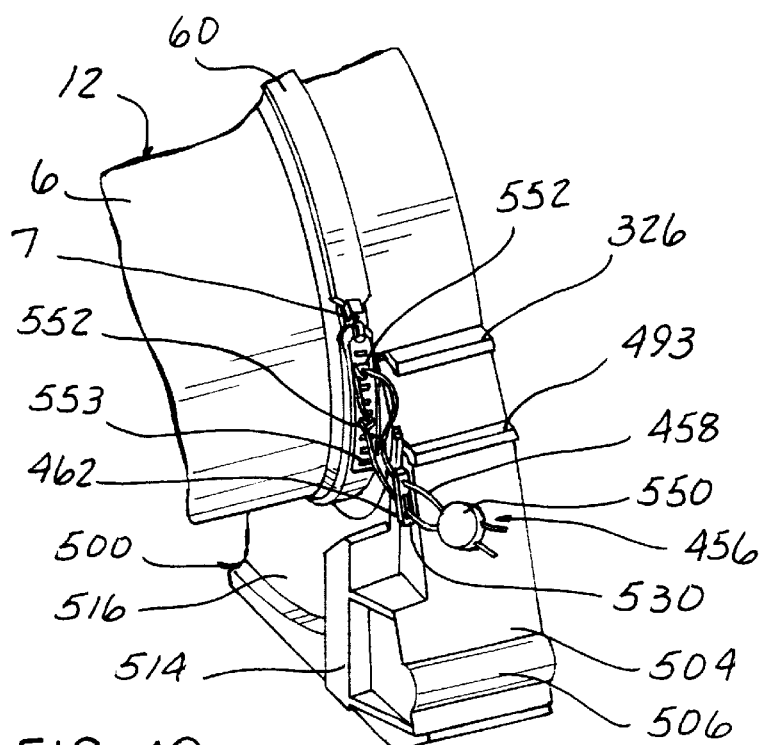
FIG. 10 is a partial, perspective view of a lower portion of the socket adapter shown in FIG. 3, with the terminal cover, watthour meter, sealing ring and wire seal depicted in their respective assembled, mounting positions.

A terminal cover denoted generally by reference number 500 in FIGS. 3 and 10 is mountable over the terminal portion 444 of the front housing 314. The terminal cover 500 includes a front wall 516 and a pair of side walls 502 and 504. The side walls 502 and 504 slide over the lower side walls 328 and 330 of the rear housing 312. A cylindrical boss 506 is formed in each side wall 502 and 504 for surrounding alignment with one of the tubular members 332 formed in the side walls 328 and 330 of the rear housing 312. A pin 507 is mounted internally and concentrically within each boss 506. The pins 507 are typically hollow tubular members which taper toward the rear edge of the terminal cover 500. The pins 507 extend through the annular support members 440 and the cylindrical members 332 when the terminal cover 500 is mounted on the front housing 314 and are perpendicular to the surface of the front housing 314 to restrict partial removal of the terminal cover 500 from the front housing 314.

An arcuate edge 510 formed on the front wall 516 extends between the side walls 502 and 504 and has an inward extending flange 512 extending therefrom. The edge 510 engages a shoulder in the rim filler extension 484.

A pair of raised channel sections 514 are integrally formed on the terminal cover 500 and extend outward from the front wall 516 of the terminal cover 500. Channel portions 514 are hollow and form an interior cavity 517 which opens to a cavity between the front wall 516 and the front cover filler 432 for the passage of the auxiliary wires through the terminal cover 500 in front of the terminals mounted behind the front housing 314.

In addition, a slot 530 is formed along one edge of the terminal cover 500 adjacent to the side wall 504 and is alignable with the outwardly extending flange 462 on the surge ground conductor 450.

As shown in FIGS. 3 and 10, the sealing ring 60 is mounted about the mounting flange 319 and the metal cover ring 7 of the watthour meter 12. The sealing ring 60 is of conventional construction and includes spaced ends which are brought into engagement when the sealing ring 60 is mounted on the mating mounting flanges. At least one and preferably two flanges 552 extending outward from one end of the sealing ring 60 pass through a slot 553 in the other end of the sealing ring 60. At least one aperture is formed in the flange 552. Due to the close proximity of the flange 462 on the surge ground conductor 450 with the flange 552 on the sealing ring 60, a conventional seal 456, such as a lead wire seal, may be used to sealingly connect the flange 462 and the flange 552 on the sealing ring 60 to provide an indication of any tampering or unauthorized removal of the sealing ring 60 from the adapter. A wire 458 is passed through the slot 464 in the flange 462 on the surge ground conductor 450 and the aperture in the flange 552 on the sealing ring 60 before the ends of the wire 458 are lockingly crimped into the lead slug 550.

This arrangement enables a single seal to be used with both the sealing ring 60 and the terminal cover 500 and eliminates the need for two separate seals, one for the sealing ring and one for the terminal cover.

The above described structure provides a unique ground path which electrically connects sealing ring 60, the meter cover ring 7, and the seal 456 to a ground in the socket adapter 310. The ground connection extends from the watthour meter cover ring 7 through the sealing ring 60 which is connected thereto, by the wire seal 456, the flange 462 on the surge ground conductor 450, and the fasteners 467, one of which is shown in FIG. 8, connecting the surge ground conductor 450 to the hanger 410. When the socket adapter 310 is mounted on a wall or support surface, the hanger 410 may engage a metal wall to provide a ground connection to the surge ground ring 450. Alternately, as shown in FIG. 5, a ground screw 451 may be threadingly engaged through an upper portion of one of the sleeves 461 extending from an end flange 456 on the surge ground conductor 450 to secure a ground wire 453 which can pass through the channels formed by the raised portions 514 of the terminal cover 500 externally of the socket adapter 310 to an external ground connection, such as a ground rod.

To complete the socket adapter 310, a plurality of electrical conductors, all generally depicted by reference number 340 in FIG. 4, are mounted in the adapter 310, between the base 420 of the front housing 314 and the base 316 of the rear housing 312.

Preferably, the conductors 340 comprise a rigid electrical conductor which is in the form of a bus bar. Generally, each conductor 340 has a polygonal cross section, i.e., rectangular, square, etc., with a rectangular shape being preferred and depicted in FIG. 4. Each conductor 340 is bent into predetermined angular sections so as to be spaced from adjacent conductors by a sufficient distance to prevent any flash or spark from passing therebetween as shown in FIG. 4. This eliminates the need for electrical insulation on the exterior of the bus bar-type electrical conductors 340.

However, it will be understood that an insulating barrier means formed of one or more divider members 339, may also be formed on the base 316 and/or the base 420 and disposed between adjacent portions of the conductors 340.

Contacts 370 and terminals 350 are arranged in the adapter 310 in the conventional watthour meter adapter positions. As shown in FIG. 4, the topmost row of contacts 370 are in contact positions 1, 9 and 3, starting from the left edge in the orientation shown in FIG. 4. Contact position 8 between contact positions 9 and 3 is empty in this exemplary embodiment. The second or lower row of contacts 370 are mounted in positions 2, 10, 7 and 4, again starting from the left edge. The conductors 340 are formed so as to interconnect the various contacts to the terminals 350 in the standard terminal portions starting from the left end in FIG. 4. Thus, the contacts in positions 1, 9 and 3 are respectively connected to the first three terminals 350 starting from the left edge in FIG. 4. Another conductors 340 connects the contact in position number 2 to the leftmost or eighth terminal 350 and the contact in position number 4 to the sixth terminal 350 all in line from the left edge of the terminals in FIG. 4. The contact in position number 7 is connected by a small, non-bus bar conductor to a jumper bus-bar conductor 341 connected to the fourth and fifth terminals.

Each conductor 340 is arranged in the socket adapter 310 with its longest dimension oriented in alignment with the longest cross sectional dimension of the blade terminals 18 of the watthour meter 12 when the meter 12 is inserted into the adapter 310.

A terminal 350 is slidably inserted over one end of each conductor 340 and receives an external conductor, not shown.

A jaw contact denoted generally by reference number 370 in FIG. 4 is fixedly mounted on the opposite end of each conductor 340. Further details concerning the construction and interconnection of the conductors 340, the terminals 350 and the jaw contacts 370 can be had by referring to U.S. application Ser. No. 08/521,009 previously incorporated herein by reference.

The conductors 340 extend in a predetermined angular arrangement, usually different for each conductor 340, from its associated terminal 350 to its associated jaw contact 370. The jaw contacts 370 attached to the one end of each conductor 340 are loosely disposed in one of the hollow receptacles 422 formed in the base 420 of the front housing portion 314, with the jaw opening substantially aligned with the slot in the receptacle 422 so as to slidably receive the blade terminal 18 of a watthour meter 12 or other electrical device therein.

What is claimed is:

1. An apparatus for grounding an external metal component on a watthour meter normally insertable through an aperture in a cover of a watthour meter socket, the apparatus comprising:

a watthour meter socket having a conductive, grounded cover;

a watthour meter having blade terminals normally insertable through the cover and into the watthour meter socket, a ground terminal carried on a base, and a mounting flange;

a first mounting flange formed on the cover of the watthour meter socket engageable with the mounting flange on the watthour meter;

a metallic sealing ring releasably mountable about the mounting flange on the cover of the watthour meter socket and the mounting flange on a watthour meter when the watthour meter is mounted in the watthour meter socket; and the ground terminal on the base of the watthour meter extending into engagement with the sealing ring when the watthour meter is mounted on the watthour meter socket and contacting the grounded cover of the watthour meter socket.

2. The apparatus of claim 1 wherein:

an outer end of the ground terminal is angularly disposed from a main portion of the ground terminal.

3. The apparatus of claim 1 wherein:

the watthour meter has an external metal cover ring disposed on the base of the watthour meter;

the sealing ring contacting the metal cover ring to connect the metal cover ring to ground.

4. An apparatus for grounding an external metal component on a watthour meter normally insertable through an aperture in a cover of a watthour meter socket, the apparatus comprising:

a watthour meter socket having a cover;

a watthour meter having blade terminals normally insertable through the cover and into the watthour meter socket;

a first mounting flange formed on the cover of the watthour meter socket;

a metallic sealing ring releasably mountable about the mounting flange on the cover of the watthour meter socket and the mounting flange on a watthour meter when the watthour meter is mounted on the watthour meter socket;

a ground terminal on the base of the watthour meter extending into engagement with the sealing ring when the watthour meter is mounted on the watthour meter socket; and contacting the cover of the watthour meter socket; and means for connecting the engaged ground terminal on the base of the watthour meter and the sealing ring with electrical ground at the cover of the watthour meter socket.

5. The apparatus of claim 4 wherein:

an outer end of the ground terminal is angularly disposed from a main portion of the ground terminal.

6. The apparatus of claim 5 wherein:

the watthour meter has an external metal cover ring disposed on the base of the watthour meter;

the sealing ring contacting the metal cover ring to connect the metal cover ring to ground.

7. The apparatus of claim 4 wherein the ground connecting means comprises:

the cover on the watthour meter socket being grounded.

8. The apparatus of claim 4 further comprising:

a watthour meter socket adapter adapted to be interposed between a watthour meter and a watthour meter socket, the watthour meter socket adapter having a housing supporting a plurality of electrical jaw contacts adapted to receive blade terminals of the watthour meter in an electrical connection and a plurality of outwardly extending blade terminals adapted to be inserted into the watthour meter socket;

first and second opposed mounting flanges formed on the watthour socket adapter housing;

the metal sealing ring releasably mountable about the mounting flange on the watthour meter and the first mounting flange formed on the watthour socket adapter housing;

another sealing ring releasably mountable about the second mounting flange on the watthour socket adapter housing and the mounting flange on the cover of the watthour meter socket;

a surge ground conductor mounted in the watthour socket adapter housing and engagable with the ground terminal on the base of the watthour meter when the watthour meter is mounted on the watthour meter socket adapter housing; and means, carried on the watthour meter socket adapter housing and coupled to the surge ground conductor, for forming an electrical ground circuit path between the surge ground conductor and the another sealing ring.

9. The apparatus of claim 8 wherein the means for forming an electrical ground circuit path further comprises:

a metal fastener extending through the watthour meter socket adapter housing and having an end positioned exteriorly of the socket adapter housing, the metal fastener electrically engaged with the surge ground conductor; and a conductive member external of the watthour socket adapter housing and engaged with the end of the metallic fastener, the conductive member engagable with the watthour meter socket cover.

* * * * *